(12) United States Patent
Yang et al.

(10) Patent No.: US 12,322,640 B2
(45) Date of Patent: Jun. 3, 2025

(54) SEMICONDUCTOR PACKAGE AND MANUFACTURING METHOD THEREOF

(71) Applicant: Taiwan Semiconductor Manufacturing Company, Ltd., Hsinchu (TW)

(72) Inventors: Sheng-Chieh Yang, Hsinchu (TW); Shing-Chao Chen, Hsinchu County (TW); Ching-Hua Hsieh, Hsinchu (TW); Chih-Wei Lin, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/356,212

(22) Filed: Jul. 20, 2023

(65) Prior Publication Data
US 2023/0360949 A1   Nov. 9, 2023

Related U.S. Application Data

(60) Continuation of application No. 17/525,975, filed on Nov. 15, 2021, now Pat. No. 11,776,838, which is a
(Continued)

(51) Int. Cl.
*H01L 21/683* (2006.01)
*H01L 21/56* (2006.01)
(Continued)

(52) U.S. Cl.
CPC ........ *H01L 21/6836* (2013.01); *H01L 21/568* (2013.01); *H01L 24/05* (2013.01); *H01L 24/13* (2013.01); *H10D 84/01* (2025.01); *H01L 2221/6834* (2013.01); *H01L 2221/68377* (2013.01); *H01L 2221/68386* (2013.01); *H01L 2224/0231* (2013.01); *H01L 2224/02381* (2013.01); *H01L 2224/10122* (2013.01)

(58) Field of Classification Search
None
See application file for complete search history.

(56) References Cited

U.S. PATENT DOCUMENTS 9,000,584 B2   4/2015   Lin et al.
9,048,222 B2   6/2015   Hung et al.
(Continued)

OTHER PUBLICATIONS

JP2004247531A, Takayuki et al, Mounting Method of Electronic Component. (Year: 2004).*
(Continued)

*Primary Examiner* — Alexander G Ghyka
(74) *Attorney, Agent, or Firm* — JCIPRNET (57) ABSTRACT

A semiconductor package includes a semiconductor device, an encapsulating material encapsulating the semiconductor device, and a redistribution structure disposed over the encapsulating material and the semiconductor device. The semiconductor device includes conductive bumps and a dielectric film encapsulating the conductive bumps, where a material of the dielectric film comprises an epoxy resin and a filler. The conductive bumps are isolated from the encapsulating material by the dielectric film. The redistribution structure is electrically connected to the conductive bumps.

20 Claims, 8 Drawing Sheets

Related U.S. Application Data division of application No. 16/547,605, filed on Aug. 22, 2019, now Pat. No. 11,177,156.

(51) Int. Cl.
*H01L 23/00* (2006.01)
*H10D 84/01* (2025.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2014/0124949 A1* | 5/2014 | Paek .................. H01L 21/6835 438/126 |
| 2017/0178988 A1* | 6/2017 | Cheney .............. H01L 21/4853 |

OTHER PUBLICATIONS

JP4474113, Solid Epoxy Resin Molding Material for Sealing and Semiconductor Device (Year: 2010).*

* cited by examiner

SEMICONDUCTOR PACKAGE AND MANUFACTURING METHOD THEREOF

CROSS-REFERENCE TO RELATED APPLICATION

This application is a continuation application of and claims the priority benefit of a prior application Ser. No. 17/525,975, filed on Nov. 15, 2021, now allowed. The prior application Ser. No. 17/525,975 is a divisional application of and claims the priority benefit of a prior application Ser. No. 16/547,605, filed on Aug. 22, 2019. The entirety of each of the above-mentioned patent applications is hereby incorporated by reference herein and made a part of this specification.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. Many integrated circuits are typically manufactured on a single semiconductor wafer. The dies of the wafer may be processed and packaged at the wafer level, and various technologies have been developed for wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 to FIG. 13 illustrate cross-sectional views of intermediate stages in the manufacturing of a semiconductor package according to some exemplary embodiments of the present disclosure.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 13 illustrate cross-sectional views of intermediate stages in the manufacturing of a semiconductor package according to some exemplary embodiments of the present disclosure. It is noted that the present disclosure will be described with respect to some embodiments in a specific context, namely an integrated fan-out package structure. The concepts in the disclosure may also apply, however, to other semiconductor structures or circuits. A semiconductor package and the manufacturing method of forming the semiconductor package and semiconductor device applicable for the semiconductor package structure are provided in accordance with various embodiments. The intermediate stages of forming the semiconductor package are illustrated in accordance with some embodiments. The variations of the embodiments are discussed. Throughout the various views and illustrative embodiments, like reference numbers are used to designate like elements.

Figure 1:
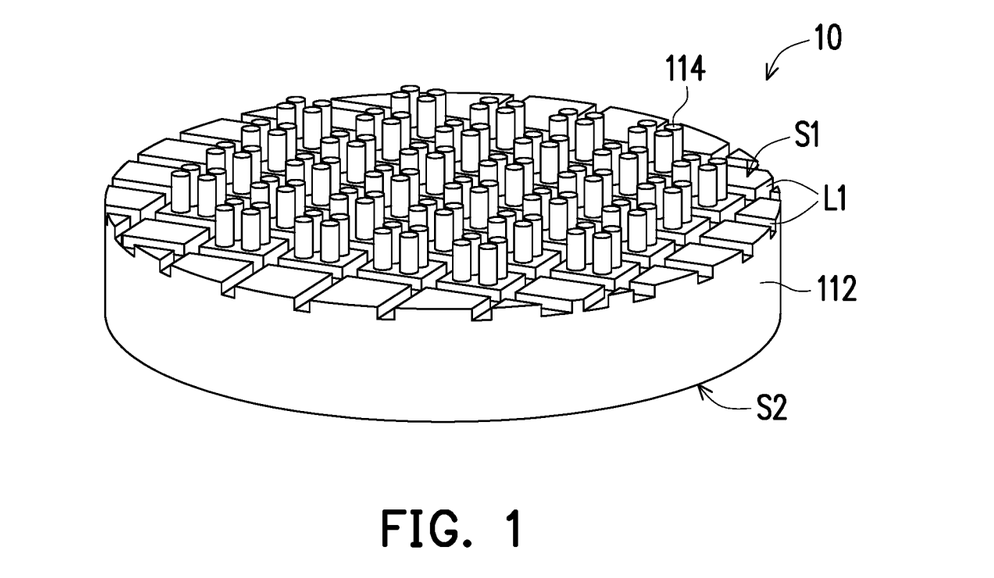

With now reference to FIG. 1, in some embodiments, a semiconductor wafer 10 is provided. In accordance with some embodiments of the disclosure, the semiconductor wafer 10 may include a partially fabricated semiconductor substrate 112 having an active side S1 and a back side S2 opposite to the active side S1. Typically, wafer fabrication for semiconductor devices is almost finished at this stage and the partially fabricated substrate is to be packaged into a final product. For example, the substrate 112 may include many partially fabricated semiconductor devices, each in a separate region separated by scribe lines L1. Each of these separate regions becomes a die when the wafer is singularized, or diced, along the scribe lines L1.

In accordance with some embodiments of the disclosure, a plurality of conductive bumps 114 are formed on the active side S1. In some embodiments, the conductive bumps 114 may be arranged into various patterns or arrays and may be of size from several microns to hundreds of microns or larger. A perspective view of a substrate 112 having conductive bumps 114 formed thereon is shown as FIG. 1.

Referring to FIG. 1, the semiconductor wafer 10 is shown having the conductive bumps 114 formed thereon. The substrate 112 may include various embedded semiconductor metal and dielectric layers corresponding to circuitry and semiconductor devices, such as transistors, resistors, capacitors, and diodes (not shown). The circuitry and devices are electrically connected to the conductive bumps 114. In some embodiments, the conductive bumps 114 may be formed by a plating or printing process and formed into a partial ball shape by heating the solder material.

Figure 2:
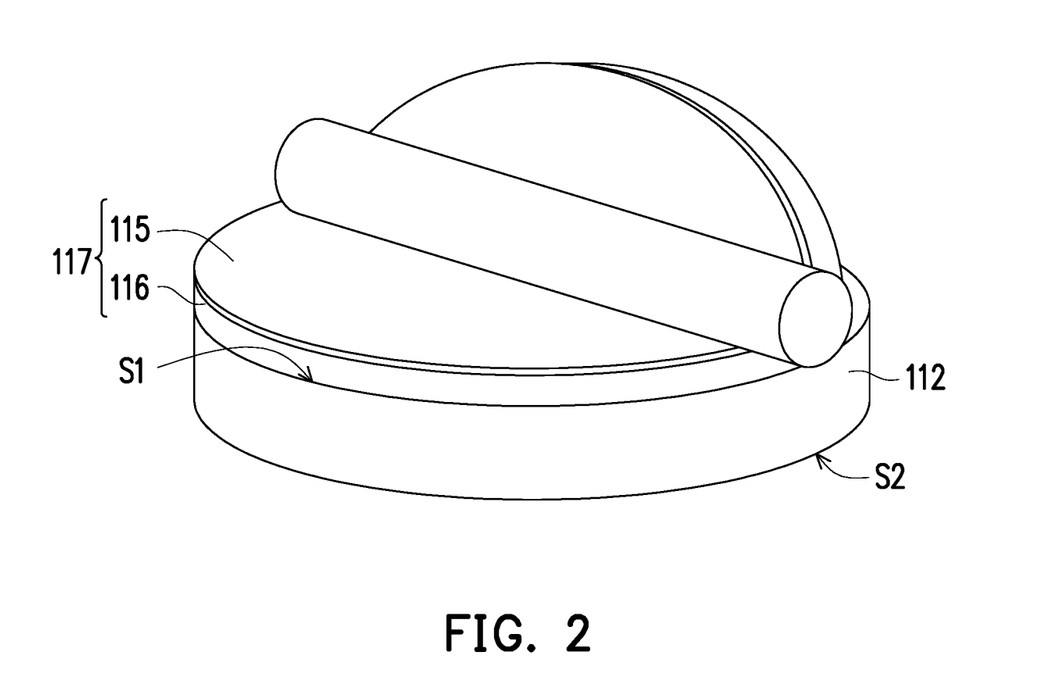

With now reference to FIG. 2, a protection film 117 is laminated on the active side S1 of the semiconductor wafer 10. In accordance with some embodiments of the disclosure, the protection film 117 may include a dielectric film 116 and a cover film 115. In some embodiments, the dielectric film 116 covers the conductive bumps 114 and the cover film 115 covers the dielectric film 116 as shown in FIG. 2. For example, materials of the dielectric film 116 may include a B-stage epoxy resin and a filler. In general, B-stage is a stage that can be achieved by utilizing heat or UV light to remove the majority of solvent from an (epoxy) adhesive, thereby allowing construction to be staged. In between adhesive application, assembly, and curing, the B-stage epoxy resin can be held for a period of time, without sacrificing performance. In some embodiments, the dielectric film 116 may include reinforcing materials such as glass fabric, fiber paper, glass fiber paper, etc., which is soaked into resin (primarily epoxy resin), for example. In some embodiments, the dielectric film 116 contains more filler than a normal dielectric layer does. For example, a percentage of the filler in the dielectric film 116 is substantially from 50% to 80%.

In accordance with some embodiments of the disclosure, the cover film 115 may be a release film, which provides protection to the dielectric film 116 and can be detached from the dielectric film 116 in the later process. In one of the implementations, the protection film 117 may be laminated on the active side S1 by laminating the dielectric film 116 on the active side S1 first, and then laminating the cover film 115 on the dielectric film 116. That is to say, the dielectric film 116 and the cover film 115 can be laminated on the active side S1 of the semiconductor wafer 10 sequentially. In an alternative embodiment, the dielectric film 116 and the cover film 115 can be bonded together and laminated on the active side S1 simultaneously by a roller, for example. The disclosure is not limited thereto.

In accordance with some embodiments of the disclosure, after the protection film 117 is laminated on the active side S1 of the semiconductor wafer 10, a curing or baking process may be performed on the protection film 117 to cure the protection film 117. In some embodiments, a temperature of the curing process is substantially below 200° C. to avoid melting of the conductive bumps 114. In one of the implementations, the protection film 117 may be baked in a heating chamber at a temperature between 130° C. and about 200° C. In accordance with some embodiments of the disclosure, a plurality of nano-bubbles may be induced during the curing process, Accordingly, the cured dielectric film 116 may include a plurality of nano-bubbles. In some embodiments, a diameter of each of the nano-bubbles is from about 10 nm to about 100 nm.

Figure 3:
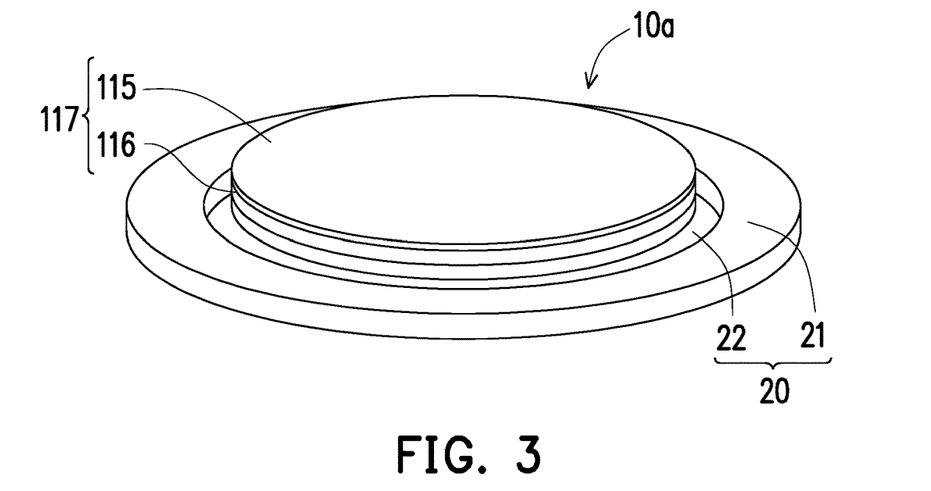

With now reference to FIG. 3, a thinning process, which may be a grinding process, is performed on the back side S2 of the semiconductor wafer 10 to form a thinned semiconductor wafer 10a. The back side S2 of the semiconductor wafer 10 may be ground to reduce the thickness thereof. With the mechanical grinding, the semiconductor wafer 10 can be ground to a thickness of about 50-100 μm, depending on the conditions. However, further reduction in the thickness of the semiconductor wafer 10 by mechanical grinding may result in damage to the wafer. Therefore, to further reduce the thickness of the semiconductor wafer 10, it is preferable to use a method less likely to cause damage during a process, such as wet chemical etching or chemical mechanical polishing (CMP), but the disclosure is not limited thereto. It is noted that the thickness of the thinned semiconductor wafer 10a can be set depending on the purpose for which the semiconductor package is used.

During the thinning process, the semiconductor wafer 10 may be held by a handler from the side where the protection film 117 is attached. Hence the protection film 117 protects the conductive bumps 114 from the handler. The thinning process reduces the weight of the semiconductor devices formed from the thinned semiconductor wafer 10a and such thinned semiconductor devices have important applications for some small portable devices.

In accordance with some embodiments of the disclosure, after the thinning process is performed on the back side S2, the thinned semiconductor wafer 10a may then be flipped over and mounted on a frame carrier 20 with the active side S1 facing up. In some embodiments, the frame carrier 20 may include a dicing frame 21 and a dicing tape 22, but the disclosure is not limited thereto. In some embodiments, the dicing frame 21 may be a sheet metal frame in a ring shape, for example, and the dicing tape 22 is adhered to the thinned semiconductor wafer 10a.

Figure 4:
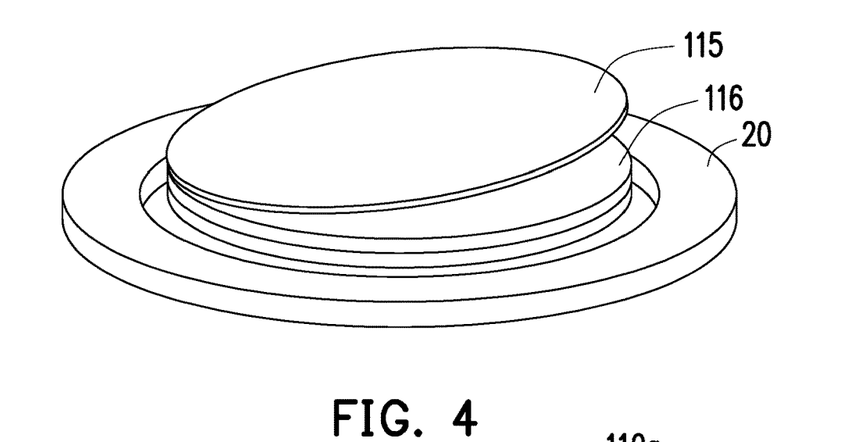

With now reference to FIG. 4, in some embodiments, the cover film 115 can be removed by a peeling process. In some embodiments, the cover film 115 may be directly peeled off from the dielectric film 116 without any further treatments. In an alternative embodiment, the cover film 115 may be peeled off after exposure of UV light or heat treatment for reducing adhesion of the cover film 115. For example, the cover film 115 may be exposed to UV light, so that the cover film 115 loses or reduces adhesion, and hence the cover film 115 can be peeled off from the dielectric film 116, but the disclosure is not limited thereto. After the cover film 115 is removed, the dielectric film 116 of the protection film 117 remains covering the conductive bumps 114.

Figure 5:
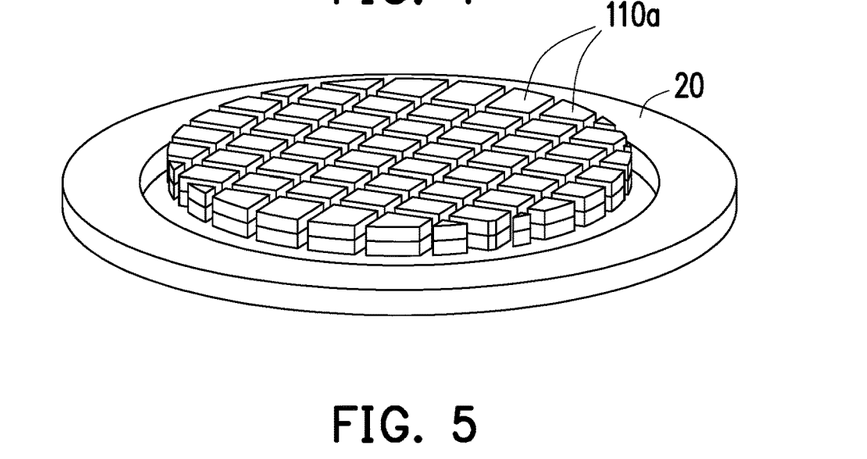

With now reference to FIG. 5, in some embodiments, a singularization process is performed on the thinned semiconductor wafer 10a with the dielectric film 116 on top (hereinafter "wafer 10a"), so as to form a plurality of semiconductor devices 110a as shown in FIG. 5. In accordance with some embodiments of the disclosure, the wafer 10a is then diced in a manner along the scribe lines L1 to separate the wafer 10a into individual semiconductor devices 110a. In some embodiments, the wafer 10a is sawed by a mechanical or laser blade along the scribe lines L1 between adjacent semiconductor devices 110a. In some embodiments, the blade is sawed through the wafer 10a and into the dicing tape 22, such that the semiconductor devices 110a are separated from one another while still attached to the frame carrier 20 by the dicing tape 22 and maintained on the frame carrier 20.

Figure 6:
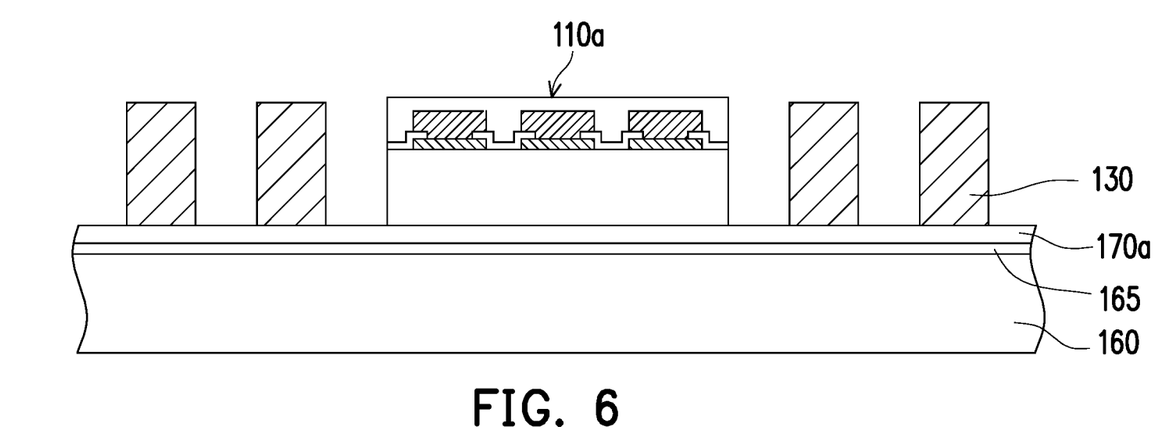

With now reference to FIG. 6, in some embodiments, at least one of the plurality of semiconductor devices 110a is picked up from the frame carrier 20 and is placed on another carrier 160. In some embodiments, the carrier 160 may further include an adhesive layer 165. The carrier 160 may be a glass carrier, a ceramic carrier, or the like. The adhesive layer 165 may be a light to heat conversion release coating (LTHC), or the like. In some embodiments, an insulation layer 170a may be optionally provided on the carrier 160, or on the adhesive layer 165 (if any). In some embodiments, before the semiconductor device 110a is disposed on the carrier 160, a plurality of conductive pillars 130 may be formed on the carrier 160, and the conductive pillars 130 surrounds a device area A1 of the carrier 160 where the semiconductor device 110a is disposed. In the present embodiment, the conductive pillars 130 are formed on the insulation layer 170a located on the carrier 160, but the disclosure is not limited thereto.

In accordance with some embodiments of the disclosure, the semiconductor device 110a formed by the process shown in FIG. 1 to FIG. 5 may include an active surface having a plurality of conductive bumps 114 and a dielectric film 116 encapsulating the conductive bumps 114. In some embodiments, the materials of the dielectric film 116 may include an epoxy resin and a filler. In some embodiments, the dielectric film 116 may include reinforcing materials such as glass fabric, fiber paper, glass fiber paper, etc., which is distributed in the resin (primarily epoxy resin), for example. In some embodiments, the dielectric film 116 contains more filler than a normal dielectric layer does. For example, a percentage of the filler in the dielectric film 116 is substantially from 50% to 80%. In accordance with some embodiments of the disclosure, the dielectric film 116 may include a plurality of nano-bubbles, and the diameter of each of the nano-bubbles is from about 10 nm to about 100 nm, for example.

In some exemplary embodiments, the conductive bumps 114 (such as copper vias) may be formed on the active surface (e.g. the top surface) of the semiconductor device 110a and electrically coupled to the bond pads 113 on the substrate 112 of the semiconductor device 110a. The bond pads 113 may be partially covered by a passivation layer, which may be polyimide, a polymer adhesive, or other insulating buffer material. The conductive bumps 114 are disposed on the bond pads 113 and fill the opening between the passivation layer. In some embodiments, the dielectric film 116 covers the active surface (e.g. the top surface) of the semiconductor device 110a, and may cover the top surfaces of the conductive bumps 114. In other embodiments, the top surface of the dielectric film 116 may be substantially level with the top surfaces of the conductive bumps 114. In some embodiments, the top ends of the conductive pillars 130 may be substantially level with the top surfaces of the conductive bumps 114. In other embodiments, the top ends of the conductive pillars 130 may be substantially higher than the top surfaces of the conductive bumps 114. Alternatively, the top ends of the conductive pillars 130 may be substantially lower than the top surfaces of the conductive bumps 114 but substantially higher than the bottom surfaces of the conductive bumps 114.

In accordance with some embodiments of the disclosure, the semiconductor device 110a may be logic device dies including logic circuits therein. In some exemplary embodiments, the semiconductor device 110a may be dies that are designed for mobile applications, and may include a Power Management Integrated Circuit (PMIC) die and a Transceiver (TRX) die, for example. Although one semiconductor device 110a is illustrated, more dies may be placed over the carrier 160 and level with one another.

With such configuration, the process of laminating the protection film 117 on the active side S1 of the semiconductor wafer 10 not only provides protection to the conductive bumps 114 during the thinning process, but also, after the cover film 115 is removed, the dielectric film 116 can function as a passivation layer for encapsulating the conductive bumps 114. Accordingly, processes of attaching a backside grinding tape and forming a passivation layer on the active side S1 of the semiconductor wafer 10 by spin coating, which is rather expensive and time consuming, can be omitted. Thereby, the manufacturing process of the semiconductor device 110a and the semiconductor package 100 can be simplified, and material and production cost thereof can be saved. In addition, the curing temperature of the dielectric film 116 is rather low (e.g. below about 200° C.), so the issue of melting the conductive bumps 114 during the curing process can be avoided.

In some exemplary embodiments, the conductive pillars 130 may be pre-formed, and are then placed on the carrier 160. In alternative embodiments, the conductive pillars 130 may be formed by, for example, plating process. The plating of the conductive pillars 130 may be performed before the placement of the semiconductor device 110a, and may include forming a seed layer (not shown) over carrier 160, forming and patterning a photo resist layer (not shown), and plating the conductive pillars 130 on the portions of the seed layer that are exposed through the photo resist layer. The photo resist layer and the portions of the seed layer covered by the photo resist layer may then be removed. The semiconductor device 110a may then be placed over the carrier 160. The material of the conductive pillars 130 may include copper, aluminum, or the like. Accordingly, the bottom ends of the conductive pillars 130 are substantially level with the back surface of the semiconductor device 110a.

Figure 7:
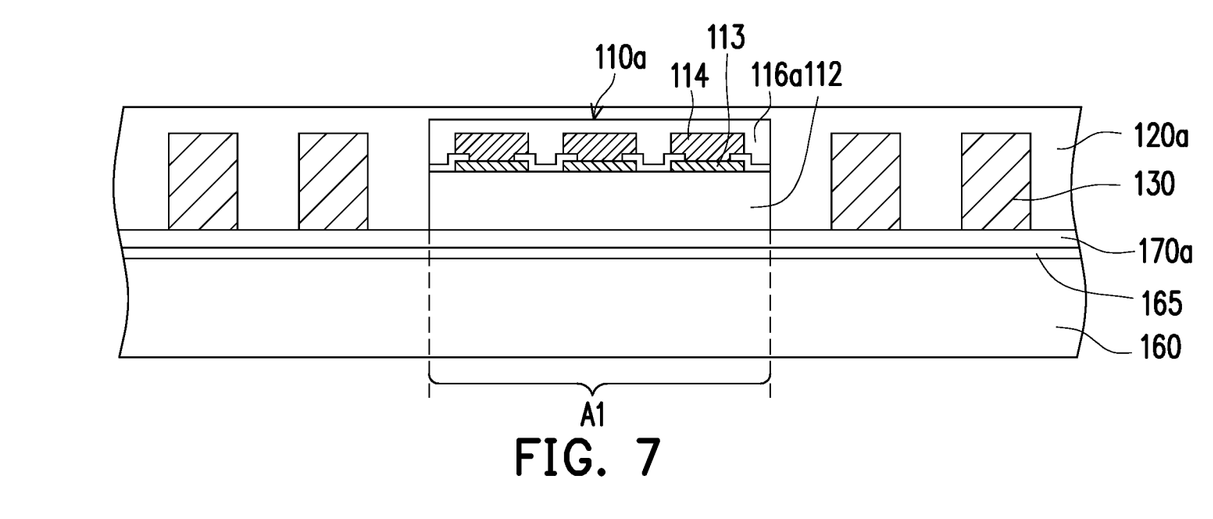

With now reference to FIG. 7, in some embodiments, the semiconductor device 110a and the conductive pillars 130 on the carrier 160 are encapsulated by an encapsulating material 120. In other words, the encapsulating material 120 is provided on the carrier 160 to encapsulate the conductive pillars 130 and the semiconductor device 110a at the device area A1. In some embodiments, the encapsulating material 120 fills the gaps between the semiconductor device 110a and the conductive pillars 130, and may be in contact with the insulation layer 170a. The encapsulating material 120 may include a molding compound, an epoxy, or a resin, etc. In some embodiments, a top surface of the encapsulating material 120 may be higher than the top ends of the conductive pillars 130 and the top surface of the dielectric layer 116a. Namely, the encapsulating material 120 covers the top ends of the conductive pillars 130 and the top surface of the dielectric layer 116a. In some embodiments, the encapsulating material 120 and the dielectric film 116 are two separate components, and the conductive bumps 114 are isolated from the encapsulating material 120 by the dielectric film 116. In some embodiments, at least a part of the materials of the encapsulating material 120 and the dielectric film 116 are different from each other.

Figure 8:
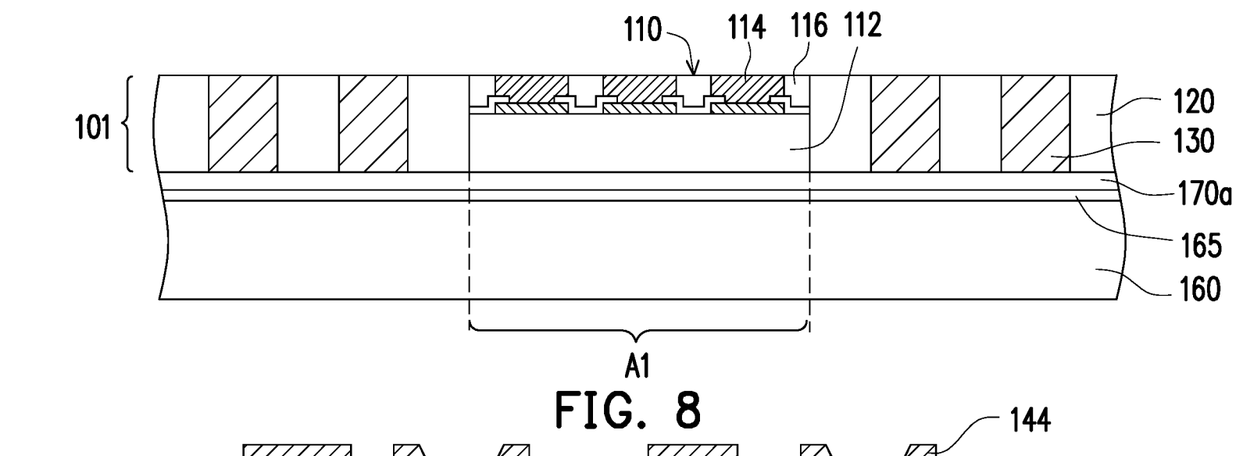

With now reference to FIG. 8, in some embodiments, a thinning process, which may be a grinding process, is performed to thin the encapsulating material 120 (and the dielectric film 116) until the top ends of the conductive pillars 130 and the top surfaces of the conductive bumps 114 are revealed. The resulting structure is shown in FIG. 8. Due to the thinning process, the top ends of the conductive pillars 130 are substantially level with the top surfaces of the conductive bumps 114, and are substantially level with the top surface of the encapsulating material 120 and the top surface of the dielectric film 116 as shown in FIG. 8. In some embodiments, the thinning process may be implemented through mechanical grinding, wet chemical etching and/or chemical mechanical polishing (CMP), but the disclosure is not limited thereto.

Throughout the description, the resultant structure including the semiconductor device 110, the conductive pillars 130 and the encapsulating material 120 as shown in FIG. 8 is referred to as encapsulated semiconductor device 101, which may have a wafer form in the process. Accordingly, in the encapsulated semiconductor device 101, the semiconductor device 110 is disposed at the die area A1, and the top surface of the dielectric film 116 may be substantially level with and reveal the top surfaces of the conductive bumps 114. The conductive pillars 130 may extend through the encapsulated semiconductor device 101 outside of the die area A1, and the encapsulating material 120 encapsulates the semiconductor device 110 and the conductive pillars 130. In other words, the encapsulating material 120 encapsulates the semiconductor device 110 therein, and the conductive pillars (through vias) 130 extends through the encapsulating material 120.

Figure 9:
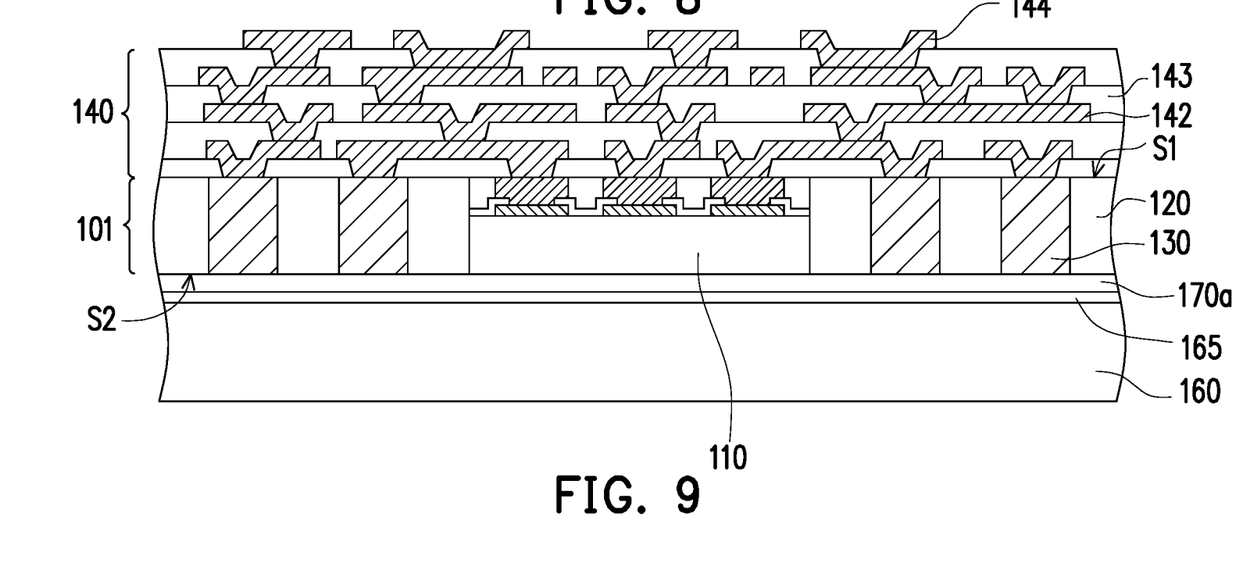

With now reference to FIG. 9, in some embodiments, a redistribution structure 140 is provided over the encapsulating material 120 and the semiconductor device 110. The redistribution structure 140 is electrically connected to the semiconductor device 110 and the conductive pillars 130. In some embodiments, the redistribution structure 140 is formed over the encapsulated semiconductor device 101 to be electrically connected to the conductive bumps 114 of the semiconductor device 110 and the conductive pillars 130. In some embodiments, the redistribution structure 140 may also interconnect the conductive bumps 114 and the conductive pillars 130. The redistribution structure 140 may be formed by, for example, depositing conductive layers, patterning the conductive layers to form redistribution circuits 142, partially covering the redistribution circuits 142 and filling the gaps between the redistribution circuits 142 with dielectric layers 143, etc. The material of the redistribution circuits 142 may include a metal or a metal alloy including aluminum, copper, tungsten, and/or alloys thereof. The dielectric layers 143 may be formed of dielectric materials such as oxides, nitrides, carbides, carbon nitrides, combinations thereof, and/or multi-layers thereof. The redistribution circuits 142 are formed in the dielectric layers 143 and electrically connected to the semiconductor device 110 and the conductive pillars 130. In addition, an under bump metallurgy (UBM) layer 144 may be formed on the redistribution structure 140 by sputtering, evaporation, or electroless plating, etc.

Figure 10:
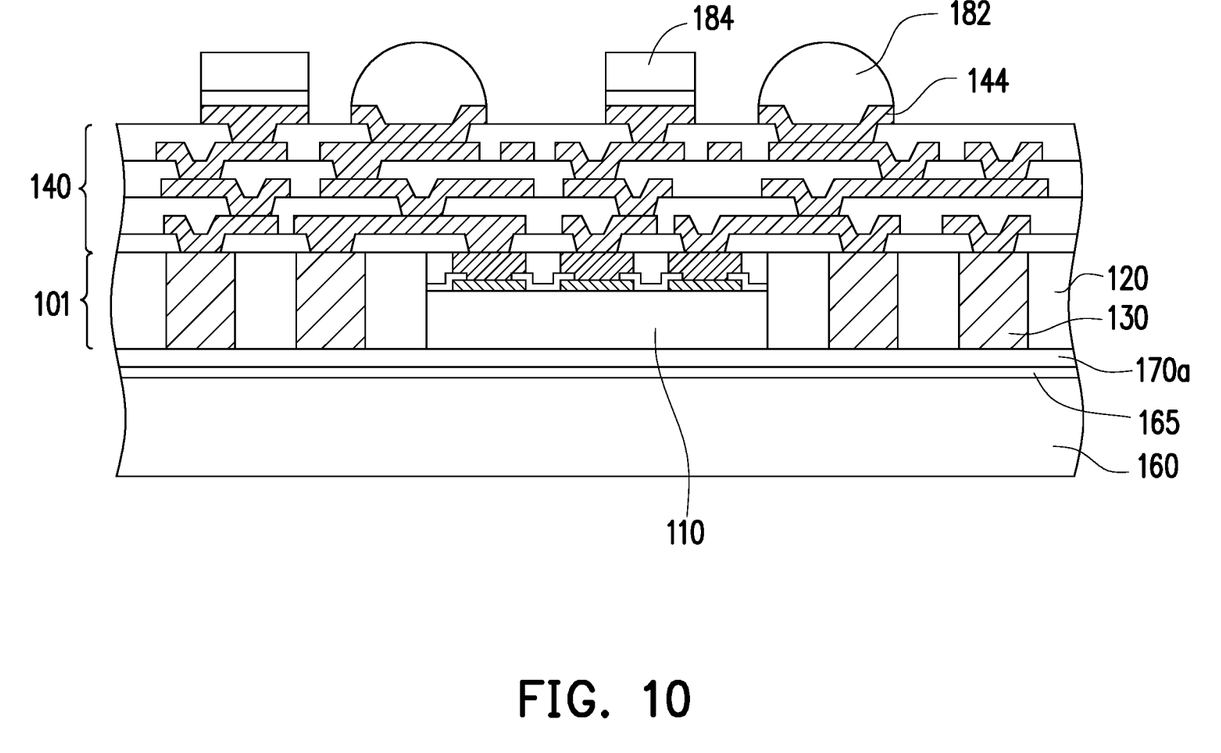

With now reference to FIG. 10, in some embodiments, at least one of electrical connector 182 and at least one integrated passive device (IPD) 184 are disposed on the redistribution structure 140 in accordance with some exemplary embodiments. The formation of the electrical connectors 182 may include placing solder balls on the UBM layer 144 (or on the redistribution structure 140), and then reflowing the solder balls. In alternative embodiments, the formation of the electrical connectors 182 may include performing a plating process to form solder regions on the UBM layer 144 (or on the redistribution structure 140), and then reflowing the solder regions. The electrical connector 182 may also include conductive pillars, or conductive pillars with solder caps, which may also be formed through plating. The IPD 184 may be fabricated using standard wafer fabrication technologies such as thin film and photolithography processing, and may be mounted on the redistribution structure 140 through, for example, flip-chip bonding or wire bonding, etc.

Figure 11:
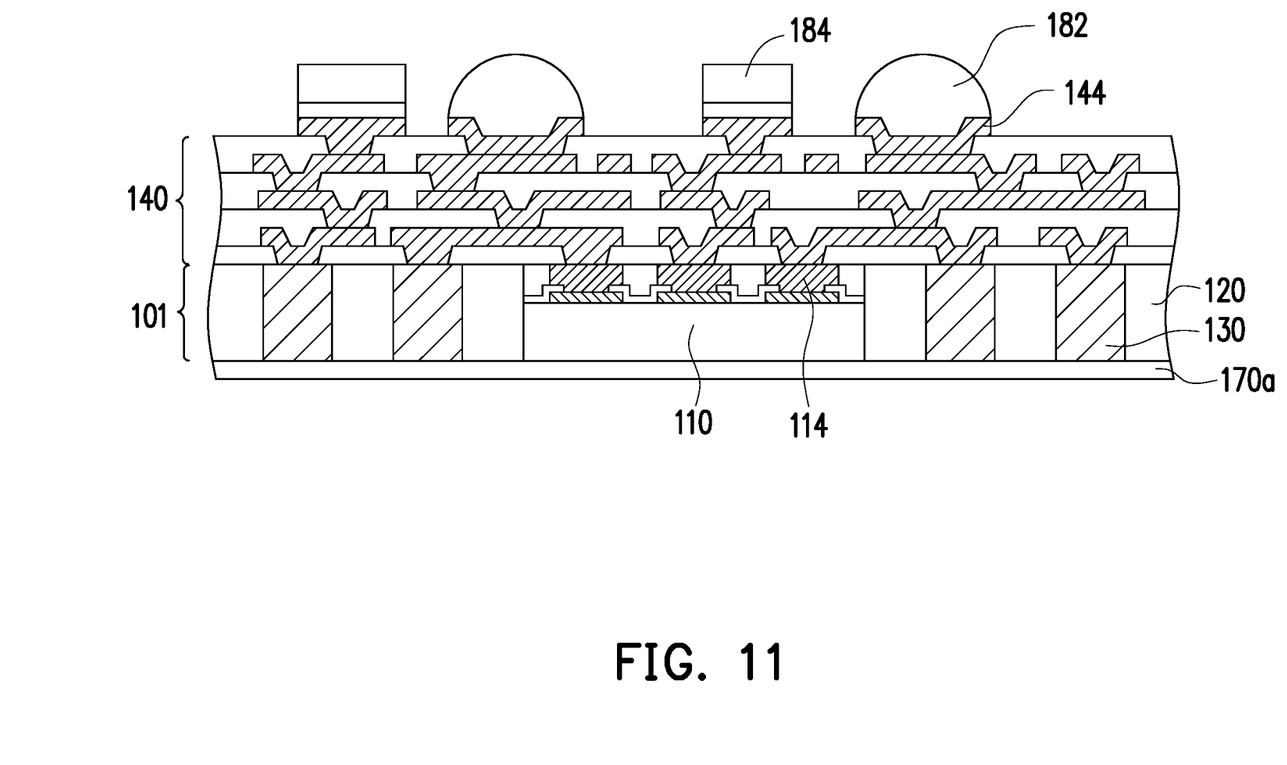
Figure 12:
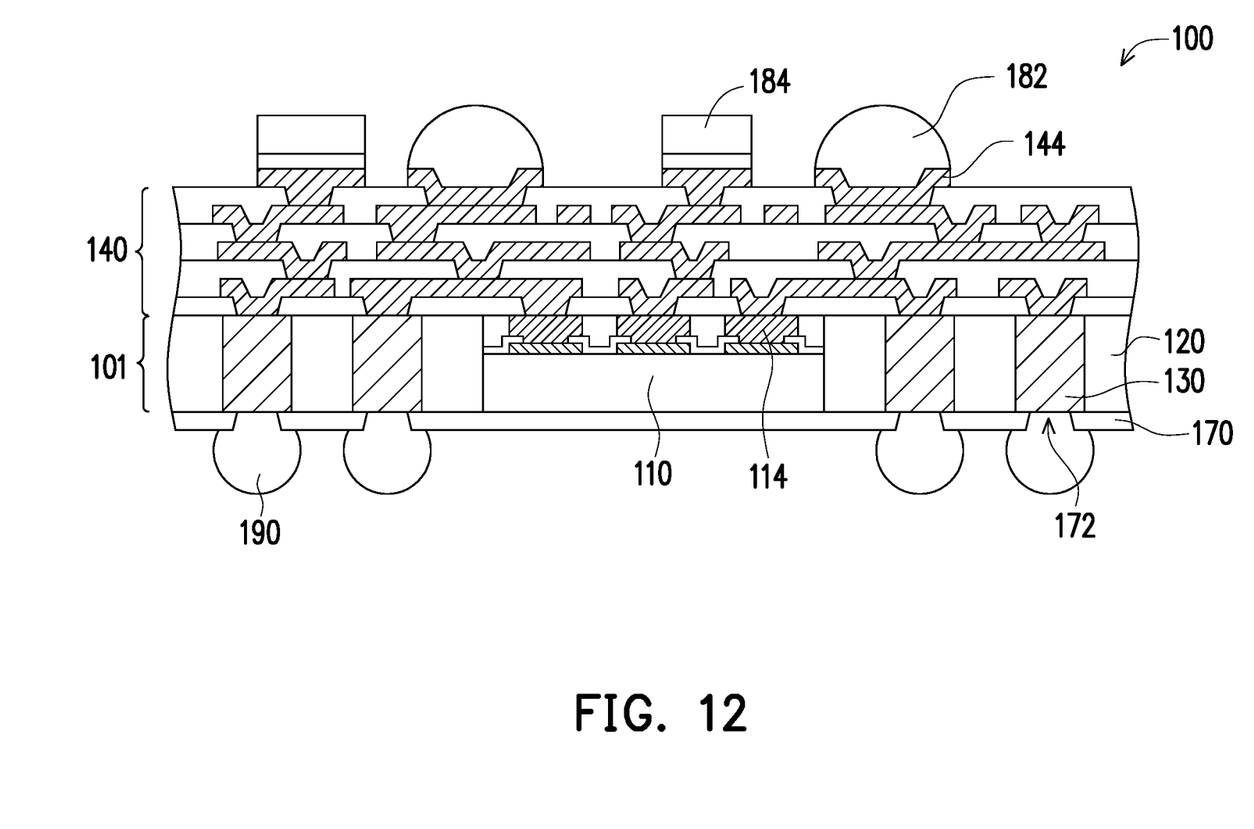

With now reference to FIG. 11, in some embodiments, the carrier 160 may be removed. In some embodiments, the carrier 160 is detached from the encapsulated semiconductor device 101, and the insulation layer 170a (if any), by causing the adhesive layer 165 to lose or reduce adhesion. The adhesive layer 165 is then removed along with the carrier 160. For example, the adhesive layer 165 may be exposed to UV light, so that the adhesive layer 165 loses or reduces adhesion, and hence the carrier 160 and the adhesive layer 165 can be removed from the encapsulated semiconductor device 101.

With now reference to FIG. 11, in some embodiments, after the carrier 160 is removed, the bottom ends of the conductive pillars 130 are revealed. In the illustrated structure, the bottom ends of the conductive pillars 130 are level with the bottom surface of the semiconductor device 110 and the bottom surface of the encapsulating material 120. In the embodiments of the insulation layer 170a being omitted, a grinding process may be performed to lightly grind the back surfaces of the semiconductor device 110 and the encapsulating material 120, and the bottom ends of the conductive pillars 130. Alternatively, the grinding process may be skipped.

In the embodiments having the insulation layer 170a, a patterning process may then be performed on the insulation layer 170a to form a plurality of openings 172. Accordingly, the insulation layer 170 having a plurality of openings 172 are formed. The openings 172 may be located on the conductive pillars 130 respectively to reveal the bottom ends of the conductive pillars 130. In some embodiments, the openings 172 may be formed by photolithography process, laser drilling process, etc. Then, a plurality of electrical terminals 190 may be formed on the encapsulated semiconductor device 101 to be electrically connected to the conductive pillars 130. In some embodiments, the electrical terminals 190 are disposed in the openings 172 of the insulation layer 170 to be connected to the conductive pillars 130. At the time, the manufacturing process of a semiconductor package 100 may be substantially done.

Figure 13:
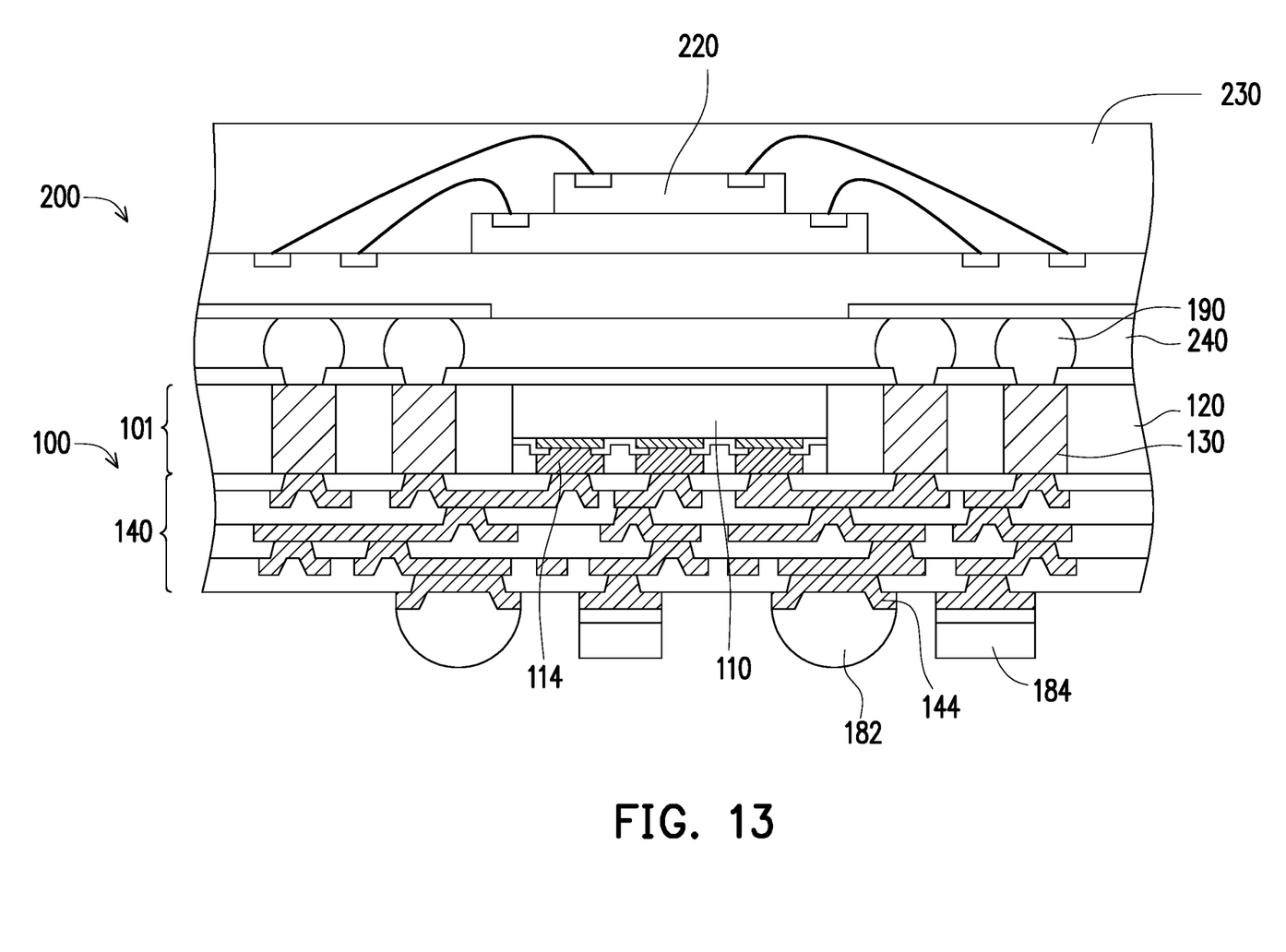

With now reference to FIG. 11, in some embodiments, a second package 200 may be mounted on and electrically connected to the first package 100 through the electrical terminals 190. Accordingly, the resulting structure as shown in FIG. 13 is a package on package structure. In some embodiments, the second package 200 may be packages, device dies, passive devices, and/or the like. In some embodiments, the package on package structure shown in FIG. 13 may combine vertically discrete memory and logic packages, and the second package 200 may be employed in a memory such as a dynamic random access memory (DRAM) and others, but the disclosure is not limited thereto.

In some embodiments, the bonding between the semiconductor package (first package) 100 and the second package 200 may be performed using flip-chip bonding through the electrical terminals 190, which may comprise solder, for example. In some embodiments, an underfill 240 may be formed between the first package 100 and the second package 200 to encapsulate the electrical terminals 190. It is appreciated that the semiconductor device 110 in the first package 100 and the semiconductor device 220 in the second package 200 may be arranged differently than in the illustrated exemplary embodiments. In some embodiments, the semiconductor device 220 is encapsulated by the insulating encapsulation 230. Then, the wafer-level package may then be sawed into a plurality of package on package structures independent from one another, with each of the package on package structures including one second package 200 bonded to one first package 100.

In sum, the protection film 117 including the dielectric film 116 and the cover film 115 covering the dielectric film 116 is laminated on the active side S1 of the semiconductor wafer 10. With such configuration, the protection film 117 not only provides protection to the conductive bumps 114 on the semiconductor wafer 10 during the thinning process, but also, after the cover film 115 is removed, the dielectric film 116 can function as a passivation layer for encapsulating the conductive bumps 114. Accordingly, processes such as attaching a backside grinding tape and forming a passivation layer on the active side S1 of the semiconductor wafer 10 by spin coating, which is rather expensive and time-consuming, can be omitted. Thereby, the manufacturing process of the semiconductor device and the semiconductor package can be simplified, and material and production cost thereof can be saved. In addition, the curing temperature of the dielectric film 116 is rather low (e.g. below about 200° C.), so the issue of melting the conductive bumps 114 during the curing process can be avoided.

Based on the above discussions, it can be seen that the present disclosure offers various advantages. It is understood, however, that not all advantages are necessarily discussed herein, and other embodiments may offer different advantages, and that no particular advantage is required for all embodiments.

In accordance with some embodiments of the disclosure, a semiconductor package includes a semiconductor device, an encapsulating material encapsulating the semiconductor device, and a redistribution structure disposed over the encapsulating material and the semiconductor device. The semiconductor device includes an active surface having conductive bumps and a dielectric film encapsulating the conductive bumps, where a material of the dielectric film comprises an epoxy resin and a filler. The conductive bumps are isolated from the encapsulating material by the dielectric film, and the redistribution structure is electrically connected to the conductive bumps.

In accordance with some embodiments of the disclosure, a semiconductor package includes a semiconductor device, an encapsulating material extending along sidewalls of the semiconductor device, and a redistribution structure. The semiconductor device includes a semiconductor substrate, conductive bumps disposed over the semiconductor substrate, and a laminated film disposed over the semiconductor substrate and extending along sidewalls of the conductive bumps. The redistribution structure overlies a top surface of the encapsulating material and top surfaces of the laminated film and the conductive bumps.

In accordance with some embodiments of the disclosure, a manufacturing method of a semiconductor package includes the following steps. A dielectric film is laminated over a semiconductor substrate to cover conductive bumps that are formed over an active side of the semiconductor substrate. A backside thinning process is performed to reduce a thickness of the semiconductor substrate, where during the backside thinning process, the dielectric film protects the conductive bumps. The dielectric film and the semiconductor substrate are cut through to form a semiconductor device. An encapsulating material is formed to laterally cover the semiconductor device, where top surfaces of the dielectric film and the conductive bumps are substantially leveled with a top surface of the encapsulating material. A redistribution structure is formed on the encapsulating material and the semiconductor device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a semiconductor device comprising a semiconductor substrate, conductive bumps over the semiconductor substrate, a dielectric film encapsulating the conductive bumps, and a passivation layer disposed over the semiconductor substrate and extending below portions of the conductive bumps, wherein a material of the dielectric film comprises an epoxy resin and a filler, an outer sidewall of the dielectric film is parallel to an outer sidewall of the semiconductor substrate, and the dielectric film is in contact with the passivation layer;
   an encapsulating material encapsulating the semiconductor device, wherein the conductive bumps are isolated from the encapsulating material by the dielectric film; and
   a redistribution structure disposed over the encapsulating material and the semiconductor device, wherein the redistribution structure is electrically connected to the conductive bumps.

2. The semiconductor package as claimed in claim 1, wherein a percentage of the filler in the dielectric film is from 50% to 80%.

3. The semiconductor package as claimed in claim 1, wherein the dielectric film comprises nano-bubbles.

4. The semiconductor package as claimed in claim 3, wherein a diameter of each of the nano-bubbles is from 10 nm to 100 nm.

5. The semiconductor package as claimed in claim 1, wherein a top surface of the dielectric film is leveled with top surfaces of the conductive bumps.

6. The semiconductor package as claimed in claim 1, wherein an inner sidewall of the dielectric film is in direct contact with sidewalls of the conductive bumps.

7. The semiconductor package as claimed in claim 1, wherein the conductive bumps comprise copper.

8. The semiconductor package as claimed in claim 1, wherein a continuous sidewall of the semiconductor device comprises the outer sidewall of the dielectric film and the outer sidewall of the semiconductor substrate.

9. The semiconductor package as claimed in claim 8, wherein an inner sidewall of the encapsulating material is in direct contact with the outer sidewall of the dielectric film and the outer sidewall of the semiconductor substrate.

10. The semiconductor package as claimed in claim 1, further comprising:
    a conductive pillar penetrating through the encapsulating material; and
    an electrical terminal electrically coupled to the conductive bumps of the semiconductor device through the redistribution structure and the conductive pillar, and the electrical terminal and the redistribution structure being disposed at two opposing sides of the conductive pillar.

11. The semiconductor package as claimed in claim 10, further comprising:
    a package component disposed below and electrically coupled to the electrical terminal; and
    an underfill disposed between the package component and the semiconductor device and surrounding the electrical terminal.

12. A semiconductor package, comprising:
    a semiconductor device comprising:
      conductive bumps disposed over a semiconductor substrate;
      a passivation layer disposed over the semiconductor substrate and extending below portions of the conductive bumps; and
      a laminated film disposed over the semiconductor substrate and extending along sidewalls of the conductive bumps, wherein sidewalls of the semiconductor substrate and the laminated film are coplanar, and the laminated film is in contact with the passivation layer;

an encapsulating material extending along sidewalls of the semiconductor device; and a redistribution structure overlying a top surface of the encapsulating material and top surfaces of the laminated film and the conductive bumps.

13. The semiconductor package as claimed in claim 12, wherein the laminated film of the semiconductor device comprises an epoxy resin and reinforcing materials distributed in the epoxy resin.

14. The semiconductor package as claimed in claim 12, wherein:

the semiconductor device further comprises bond pads disposed over the semiconductor substrate, each of the conductive bumps land on one of the bond pads, and a material of the laminated film is different from a material of the passivation layer.

15. The semiconductor package as claimed in claim 12, wherein the top surface of the encapsulating material and the top surfaces of the laminated film and the conductive bumps are leveled with one another.

16. A semiconductor package, comprising:

a semiconductor device comprising conductive bumps, a passivation layer disposed over a semiconductor substrate and extending below portions of the conductive bumps, and a bubble-containing dielectric film laterally covering the conductive bumps;

an encapsulating material laterally covering the semiconductor device, the encapsulating material laterally interfacing the bubble-containing dielectric film, and surfaces of the encapsulating material and the bubble-containing dielectric film being leveled with each other, wherein at least a part of materials of the encapsulating material and the bubble-containing dielectric film are different from each other, and the bubble-containing dielectric film is in contact with the passivation layer; and a redistribution structure overlying the encapsulating material and the semiconductor device and electrically coupled to the conductive bumps.

17. The semiconductor package as claimed in claim 16, wherein the bubble-containing dielectric film comprises an epoxy resin and fillers in the epoxy resin.

18. The semiconductor package as claimed in claim 17, wherein a percentage of the fillers in the bubble-containing dielectric film is from 50% to 80%.

19. The semiconductor package as claimed in claim 16, wherein a diameter of a bubble in the bubble-containing dielectric film is from about 10 nm to about 100 nm.

20. The semiconductor package as claimed in claim 16, wherein the bubble-containing dielectric film comprises more fillers than a dielectric layer of the redistribution structure does.

* * * * *